United States Patent
Maw et al.

(10) Patent No.: US 11,923,175 B2
(45) Date of Patent: Mar. 5, 2024

(54) SYSTEMS AND METHODS FOR VARIABLE GAIN TUNING OF MATCHING NETWORKS

(71) Applicant: COMET TECHNOLOGIES USA, INC., San Jose, CA (US)

(72) Inventors: Dean Maw, San Jose, CA (US); Anthony Oliveti, San Jose, CA (US); Keith Rouse, San Jose, CA (US); Gary Russell, San Jose, CA (US); Tigran Poghosyan, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 131 days.

(21) Appl. No.: 17/386,880

(22) Filed: Jul. 28, 2021

(65) Prior Publication Data
US 2023/0031768 A1    Feb. 2, 2023

(51) Int. Cl.
*H01J 37/32*    (2006.01)
*H05H 1/46*    (2006.01)

(52) U.S. Cl.
CPC ..... *H01J 37/32183* (2013.01); *H05H 1/4645* (2021.05)

(58) Field of Classification Search
CPC .......... H01J 37/32183; H05H 1/4645
See application file for complete search history.

(56) References Cited

U.S. PATENT DOCUMENTS

| | | |
|---|---|---|
| 4,679,007 A | 7/1987 | Reese et al. |
| 5,175,472 A | 12/1992 | Johnson, Jr. et al. |
| 5,195,045 A | 3/1993 | Keane et al. |
| 5,394,061 A | 2/1995 | Fujii |
| 5,474,648 A | 12/1995 | Patrick et al. |

(Continued)

FOREIGN PATENT DOCUMENTS

| | | | |
|---|---|---|---|
| CN | 107154334 A | * 9/2017 | ............. G05B 17/02 |
| JP | 04239211 A | 8/1992 | |

(Continued)

OTHER PUBLICATIONS

PCT/US2018/062951—International Search Report and Written Opinion of International Searching Authority, dated Aug. 28, 2019, 10 pages.

(Continued)

*Primary Examiner* — Henry Luong
(74) *Attorney, Agent, or Firm* — Nolte Lackenbach Siegel

(57) ABSTRACT

Disclosed is a method and apparatus for utilizing a variable gain algorithm for adjusting a capacitor in an automatic radio frequency (RF) impedance matching network. The apparatus may operate in a closed-loop feedback control system, with one or more error signals driving the capacitors within the system. To achieve a critically damped control system response, multiple operating regions for the matching network and its constituent elements may be identified and a set of gains (e.g., different per region) may be applied to the error signals in the control system when operating in those regions. An operating region may be defined by characteristics of the input signals measured by the apparatus, calculated by the apparatus, or the state of the apparatus itself. These features may be arranged in a look up table (or determined by calculation) for the apparatus to use to determine the variable gains in the system.

20 Claims, 11 Drawing Sheets

(56) References Cited

U.S. PATENT DOCUMENTS

| | | |
|---|---|---|
| 5,576,629 A | 11/1996 | Turner et al. |
| 5,609,737 A | 3/1997 | Fukui et al. |
| 5,629,653 A | 5/1997 | Stimson |
| 5,737,175 A | 4/1998 | Grosshart et al. |
| 5,792,261 A | 8/1998 | Hama et al. |
| 5,810,963 A | 9/1998 | Tomioka |
| 5,842,154 A | 11/1998 | Harnett et al. |
| 5,849,136 A | 12/1998 | Mintz et al. |
| 5,866,869 A | 2/1999 | Schneider |
| 5,889,252 A | 3/1999 | Williams et al. |
| 5,910,886 A | 6/1999 | Coleman |
| 5,914,974 A | 6/1999 | Partlo |
| 6,016,131 A | 1/2000 | Sato et al. |
| 6,157,179 A | 12/2000 | Miermans |
| 6,164,241 A | 12/2000 | Chen et al. |
| 6,252,354 B1 | 6/2001 | Collins et al. |
| 6,313,584 B1 * | 11/2001 | Johnson ............ H01J 37/32183 315/111.21 |
| 6,313,587 B1 | 11/2001 | MacLennan et al. |
| 6,326,597 B1 | 12/2001 | Lubomirsky et al. |
| 6,407,648 B1 | 6/2002 | Johnson |
| 6,455,437 B1 | 9/2002 | Davidow et al. |
| 6,463,875 B1 | 10/2002 | Chen et al. |
| 6,507,155 B1 | 1/2003 | Barnes et al. |
| 6,677,828 B1 | 1/2004 | Harnett et al. |
| 6,703,080 B2 | 3/2004 | Reyzelman |
| 6,806,437 B2 | 10/2004 | Oh |
| 6,876,155 B2 | 4/2005 | Howald et al. |
| 6,894,245 B2 | 5/2005 | Hoffman |
| 6,949,887 B2 | 9/2005 | Kirkpatrick et al. |
| 7,030,335 B2 | 4/2006 | Hoffman |
| 7,042,311 B1 | 5/2006 | Hilliker et al. |
| 7,079,597 B1 | 7/2006 | Kenwood |
| 7,102,292 B2 | 9/2006 | Parsons et al. |
| 7,192,505 B2 | 3/2007 | Roche et al. |
| 7,196,283 B2 | 3/2007 | Buchberger, Jr. |
| 7,215,697 B2 | 5/2007 | Hill et al. |
| 7,220,937 B2 | 5/2007 | Hoffman |
| 7,251,121 B2 | 7/2007 | Bhutta |
| 7,259,623 B2 | 8/2007 | Coleman |
| 7,298,128 B2 | 11/2007 | Bhutta |
| 7,467,612 B2 | 12/2008 | Suckewer |
| 7,514,936 B2 | 4/2009 | Anwar |
| 7,795,877 B2 | 9/2010 | Radtke |
| 7,796,368 B2 | 9/2010 | Kotani |
| 8,169,162 B2 | 5/2012 | Yuzurihara |
| 8,203,372 B2 | 6/2012 | Arduini |
| 8,222,822 B2 | 7/2012 | Gilbert |
| 8,421,377 B2 | 4/2013 | Kirchmeier |
| 8,466,622 B2 | 6/2013 | Knaus |
| 8,471,746 B2 | 6/2013 | Kurunezi et al. |
| 8,491,759 B2 | 7/2013 | Pipitone et al. |
| 8,742,669 B2 | 6/2014 | Carter et al. |
| 8,779,662 B2 | 7/2014 | Boston |
| 8,803,424 B2 | 8/2014 | Boston |
| 8,884,180 B2 | 11/2014 | Ilie |
| 8,896,391 B2 | 11/2014 | du Toit |
| 8,928,229 B2 | 1/2015 | Boston |
| 9,042,121 B2 | 5/2015 | Walde et al. |
| 9,065,426 B2 | 6/2015 | Mason et al. |
| 9,105,447 B2 | 8/2015 | Brouk et al. |
| 9,111,725 B2 | 8/2015 | Boston |
| 9,124,248 B2 | 9/2015 | Van Zyl et al. |
| 9,142,388 B2 | 9/2015 | Hoffman et al. |
| 9,148,086 B2 | 9/2015 | Fife et al. |
| 9,166,481 B1 | 10/2015 | Vinciarelli |
| 9,171,700 B2 | 10/2015 | Gilmore |
| 9,196,459 B2 | 11/2015 | Bhutta |
| 9,208,992 B2 | 12/2015 | Brouk et al. |
| 9,224,579 B2 | 12/2015 | Finley et al. |
| 9,225,299 B2 | 12/2015 | Mueller et al. |
| 9,287,098 B2 | 3/2016 | Finley et al. |
| 9,294,100 B2 | 3/2016 | Van Zyl et al. |
| 9,306,533 B1 | 4/2016 | Mavretic |
| 9,313,870 B2 | 4/2016 | Walde et al. |
| 9,337,804 B2 | 5/2016 | Mason et al. |
| 9,345,122 B2 | 5/2016 | Bhutta |
| 9,385,021 B2 | 7/2016 | Chen |
| 9,418,822 B2 | 8/2016 | Kaneko |
| 9,478,397 B2 | 10/2016 | Blackburn et al. |
| 9,483,066 B2 | 11/2016 | Finley et al. |
| 9,490,353 B2 | 11/2016 | Van Zyl et al. |
| 9,496,122 B1 | 11/2016 | Bhutta |
| 9,520,269 B2 | 12/2016 | Finley et al. |
| 9,524,854 B2 | 12/2016 | Hoffman et al. |
| 9,525,412 B2 | 12/2016 | Mavretic |
| 9,536,713 B2 | 1/2017 | Van Zyl et al. |
| 9,543,122 B2 | 1/2017 | Bhutta |
| 9,544,987 B2 | 1/2017 | Mueller et al. |
| 9,558,917 B2 | 1/2017 | Finley et al. |
| 9,577,516 B1 | 2/2017 | Van Zyl et al. |
| 9,584,090 B2 | 2/2017 | Mavretic |
| 9,578,731 B2 | 3/2017 | Hoffman et al. |
| 9,591,739 B2 | 3/2017 | Bhutta |
| 9,589,767 B2 | 4/2017 | Finley et al. |
| 9,620,340 B2 | 4/2017 | Finley et al. |
| 9,651,957 B1 | 5/2017 | Finley et al. |
| 9,660,613 B2 | 5/2017 | Van Zyl et al. |
| 9,673,028 B2 | 6/2017 | Walde et al. |
| 9,697,911 B2 | 7/2017 | Bhutta |
| 9,711,331 B2 | 7/2017 | Mueller et al. |
| 9,711,335 B2 | 7/2017 | Christie et al. |
| 9,728,378 B2 | 8/2017 | Bhutta et al. |
| 9,729,122 B2 | 8/2017 | Mavretic |
| 9,741,544 B2 | 8/2017 | Van Zyl et al. |
| 9,745,660 B2 | 8/2017 | Bhutta |
| 9,748,076 B1 | 8/2017 | Choi et al. |
| 9,755,641 B1 | 9/2017 | Bhutta |
| 9,773,644 B2 | 9/2017 | Van Zyl et al. |
| 9,807,863 B1 | 10/2017 | Van Zyl et al. |
| 9,812,305 B2 | 11/2017 | Pelleymounter et al. |
| 9,844,127 B2 | 12/2017 | Bhutta |
| 9,852,890 B2 | 12/2017 | Mueller et al. |
| 9,854,659 B2 | 12/2017 | Van Zyl et al. |
| 9,865,432 B1 | 1/2018 | Bhutta |
| 9,952,297 B2 | 4/2018 | Wang |
| 10,008,317 B2 | 6/2018 | Iyer |
| 10,020,752 B1 | 7/2018 | Vinciarelli |
| 10,026,592 B2 | 7/2018 | Chen |
| 10,026,594 B2 | 7/2018 | Bhutta |
| 10,026,595 B2 | 7/2018 | Choi et al. |
| 10,074,518 B2 | 9/2018 | Van Zyl et al. |
| 10,139,285 B2 | 11/2018 | Murray et al. |
| 10,141,788 B2 | 11/2018 | Kamstedt |
| 10,194,518 B2 | 1/2019 | Van Zyl et al. |
| 10,217,618 B2 | 2/2019 | Larson et al. |
| 10,224,184 B2 | 3/2019 | Van Zyl |
| 10,224,186 B2 | 3/2019 | Polak et al. |
| 10,263,577 B2 | 4/2019 | Van Zyl et al. |
| 10,269,540 B1 | 4/2019 | Carter et al. |
| 10,314,156 B2 | 6/2019 | Van Zyl et al. |
| 10,332,730 B2 | 6/2019 | Christie et al. |
| 10,340,879 B2 | 7/2019 | Mavretic |
| 10,373,811 B2 | 8/2019 | Christie et al. |
| 10,374,070 B2 | 8/2019 | Wood |
| 10,410,836 B2 | 9/2019 | McChesney |
| 10,411,769 B2 | 9/2019 | Bae |
| 10,447,174 B1 | 10/2019 | Porter, Jr. et al. |
| 10,469,108 B2 | 11/2019 | Howald |
| 10,475,622 B2 | 11/2019 | Pankratz et al. |
| 2002/0123237 A1 * | 9/2002 | Nguyen ............ H01J 37/32137 118/712 |
| 2003/0121609 A1 | 7/2003 | Ohmi et al. |
| 2003/0150710 A1 | 8/2003 | Evans et al. |
| 2003/0230984 A1 | 12/2003 | Kitamura et al. |
| 2004/0016402 A1 | 1/2004 | Walther et al. |
| 2004/0026235 A1 | 2/2004 | Stowell, Jr. |
| 2005/0034811 A1 | 2/2005 | Mahoney et al. |
| 2005/0045475 A1 | 3/2005 | Wantanabe |
| 2005/0270805 A1 | 12/2005 | Yasumura |
| 2006/0005928 A1 | 1/2006 | Howald |
| 2006/0169582 A1 | 8/2006 | Brown et al. |
| 2006/0169584 A1 | 8/2006 | Brown et al. |
| 2006/0249729 A1 | 11/2006 | Mundt et al. |

(56) References Cited

U.S. PATENT DOCUMENTS

| | | |
|---|---|---|
| 2007/0121267 A1 | 5/2007 | Kotani |
| 2007/0222428 A1 | 9/2007 | Garvin et al. |
| 2008/0061793 A1 | 3/2008 | Anwar et al. |
| 2008/0061901 A1 | 3/2008 | Gilmore |
| 2008/0087381 A1 | 4/2008 | Shannon et al. |
| 2008/0197854 A1 | 8/2008 | Valcore et al. |
| 2008/0272875 A1 | 11/2008 | Huang et al. |
| 2008/0317974 A1 | 12/2008 | de Vries |
| 2009/0026964 A1 | 1/2009 | Knaus |
| 2009/0206974 A1 | 8/2009 | Meinke |
| 2010/0012029 A1 | 1/2010 | Forester et al. |
| 2010/0072172 A1 | 3/2010 | Ui et al. |
| 2010/0096261 A1 | 4/2010 | Hoffman et al. |
| 2010/0098882 A1 | 4/2010 | Lubomirsky et al. |
| 2010/0159120 A1 | 6/2010 | Dzengeleski et al. |
| 2011/0121735 A1 | 5/2011 | Penny |
| 2011/0140607 A1 | 6/2011 | Moore et al. |
| 2011/0148303 A1 | 6/2011 | Van Zyl et al. |
| 2011/0174777 A1 | 7/2011 | Jensen et al. |
| 2011/0214811 A1* | 9/2011 | Ashida ............... C23F 1/08 333/33 |
| 2012/0097104 A1 | 4/2012 | Pipitone et al. |
| 2012/0097524 A1 | 4/2012 | Pipitone et al. |
| 2012/0145322 A1 | 6/2012 | Gushiken et al. |
| 2012/0164834 A1 | 6/2012 | Jennings et al. |
| 2012/0262064 A1 | 10/2012 | Nagarkatti |
| 2013/0002136 A1 | 1/2013 | Blackburn et al. |
| 2013/0140984 A1 | 6/2013 | Hirayama |
| 2013/0180964 A1 | 7/2013 | Ilic |
| 2013/0214683 A1 | 8/2013 | Valcore et al. |
| 2013/0240482 A1 | 9/2013 | Nam et al. |
| 2013/0278140 A1 | 10/2013 | Mudunuri et al. |
| 2013/0345847 A1 | 12/2013 | Valcore et al. |
| 2014/0225504 A1 | 8/2014 | Kaneko |
| 2014/0239813 A1 | 8/2014 | Van Zyl |
| 2014/0265911 A1 | 9/2014 | Kamata et al. |
| 2014/0328027 A1 | 11/2014 | Zhang et al. |
| 2014/0367043 A1 | 12/2014 | Bishara et al. |
| 2015/0002020 A1 | 1/2015 | Boston |
| 2015/0115797 A1 | 4/2015 | Yuzurihara |
| 2015/0150710 A1 | 6/2015 | Evans et al. |
| 2015/0313000 A1 | 10/2015 | Thomas et al. |
| 2016/0002020 A1 | 1/2016 | Orita |
| 2016/0248396 A1 | 8/2016 | Mavretic |
| 2016/0308560 A1 | 10/2016 | Howald et al. |
| 2017/0018349 A1 | 1/2017 | Otsubo et al. |
| 2017/0133886 A1 | 5/2017 | Kurs et al. |
| 2017/0338081 A1 | 11/2017 | Yamazawa |
| 2017/0345620 A1 | 11/2017 | Coumou et al. |
| 2018/0034446 A1 | 1/2018 | Wood |
| 2018/0102238 A1 | 4/2018 | Gu et al. |
| 2018/0261431 A1 | 9/2018 | Hammond, IV |
| 2018/0358205 A1* | 12/2018 | Long ............... H01J 37/32174 |
| 2019/0103293 A1 | 4/2019 | Kim et al. |
| 2019/0172683 A1 | 6/2019 | Mavretic |
| 2019/0199241 A1 | 6/2019 | Satoshi et al. |
| 2019/0385822 A1 | 12/2019 | Marakhtanov et al. |
| 2020/0126761 A1* | 4/2020 | Coumou ........... H01J 37/32183 |

FOREIGN PATENT DOCUMENTS

| | | |
|---|---|---|
| JP | 05284046 A | 8/1993 |
| JP | 2006-310245 A | 6/2008 |
| JP | 2010-016124 A | 1/2010 |
| JP | 2011-187503 A | 9/2011 |
| JP | 2015-502213 A | 1/2015 |
| KR | 10-2006-0067957 A | 6/2006 |
| KR | 10-2008-0094155 A | 10/2008 |
| KR | 10-2014-0077866 A | 6/2014 |
| KR | 10-2017-0127724 A | 11/2017 |
| KR | 10-2018-0038596 A | 4/2018 |
| WO | 2012054305 | 4/2012 |
| WO | 2012054306 | 4/2012 |
| WO | 2012054307 | 4/2012 |
| WO | 2016048449 A1 | 3/2016 |
| WO | 2016097730 | 6/2016 |
| WO | 2019096564 A1 | 5/2019 |
| WO | 2019147513 A1 | 8/2019 |
| WO | 2019-244734 A1 | 12/2019 |

OTHER PUBLICATIONS

Stowell, et al., "RF-superimposed DC and pulsed DC sputtering for deposition of transparent conductive oxides", Thin Solid Films 515 (2007), pp. 7654-7657.

Bender, et al., "Characterization of a RF=dc-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 18-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/038892—International Search Report and Written Opinion of the International Searching Authority, dated Oct. 6, 2020, 3 pages.

PCT/US2020/038899—International Search Report and Written Opinion of the International Searching Authority, dated Sep. 26, 2019, 5 pages.

PCT/US2021/012847—International Search Report and Written Opinion of the International Searching Authority, dated May 6, 2021, 11 pages.

PCT/US2021/012849 International Search Report and Written Opinion of the International Searching Authority, dated May 10, 2021, 11 pages.

PCT/US2021/012851 International Search Report and Written Opinion of the International Searching Authority, dated May 6, 2021, 10 pages.

PCT/US2022/034284—International Search Report and Written Opinion of the International Searching Authority, dated Oct. 21, 2022, 9 pages.

* cited by examiner

Frequency and Duty Cycle Gain Table Example

| Frequency (Hz) | Duty Cycle (%) | Gain |
|---|---|---|
| 10 | 0 | 21 |
| 10 | 50 | 31 |
| 10 | 90 | 31 |
| 100 | 0 | 26 |
| 100 | 50 | 33 |
| 100 | 90 | 40 |
| 500 | 0 | 58 |
| 500 | 50 | 63 |
| 500 | 90 | 70 |
| 1000 | 0 | 90 |
| 1000 | 50 | 112 |
| 1000 | 90 | 145 |

Variable Gain Table Example

| Match Region of Operation | Up Gain | Down Gain |
|---|---|---|
| 1 | 1000 | 500 |
| 2 | 950 | 450 |
| 3 | 875 | 422 |
| 4 | 700 | 365 |
| 5 | 625 | 340 |
| 6 | 515 | 286 |
| 7 | 405 | 250 |

FIG. 5

SYSTEMS AND METHODS FOR VARIABLE GAIN TUNING OF MATCHING NETWORKS

BACKGROUND

Radio frequency ("RF") plasma-enhanced processing is extensively used in semiconductor manufacturing to etch different types of films, deposit thin films at low to intermediate processing temperatures, and perform surface treatment and cleaning. One characteristic of such processes is the employment of a plasma, i.e., a partially ionized gas, that is used to generate neutral species and ions from precursors inside a reaction chamber, provide energy for ion bombardment, and/or perform other actions. Radio frequency plasma-enhanced processing is performed by what are known as radio frequency processing devices.

Radio frequency plasma processing devices may include a radio frequency power generator that transmits a signal to a plasma reaction chamber. A radio frequency matching device, which may have a variable impedance, may be located between the radio frequency power generator and the plasma reaction chamber. The radio frequency matching device may be controlled, or otherwise tuned by varying the impedance of the radio frequency matching device. Tuning the radio frequency matching device reduces reflected power from the plasma reaction chamber and/or the radio frequency matching device, which may increase power that is transferred from the radio frequency power generator to the plasma reaction chamber and into the plasma process.

Tuning may be performed, in part, via variable capacitors which may have their capacitance adjusted by a motor. The goal of the adjustment is to provide the proper settings so that the combination of capacitors on different parts of a tuning network perform tuning so that power is efficiently transferred from input to the plasma chamber. In this context, efficiency relates to minimizing reflections and properly converting the impedance of the reaction chamber so that, viewing from the input, the forward power sees the proper impedance (e.g., 50 Ohms). Typical tuning algorithms utilize a fixed gain when calculating an adjustment for the variable capacitors.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

FIG. 5 is a table showing one example of many possible implementations for different variable gain values and techniques (based on a region of operation for a matching network and including different up/down gain values) according to embodiments of the present disclosure.

DETAILED DESCRIPTION

Figure 1:
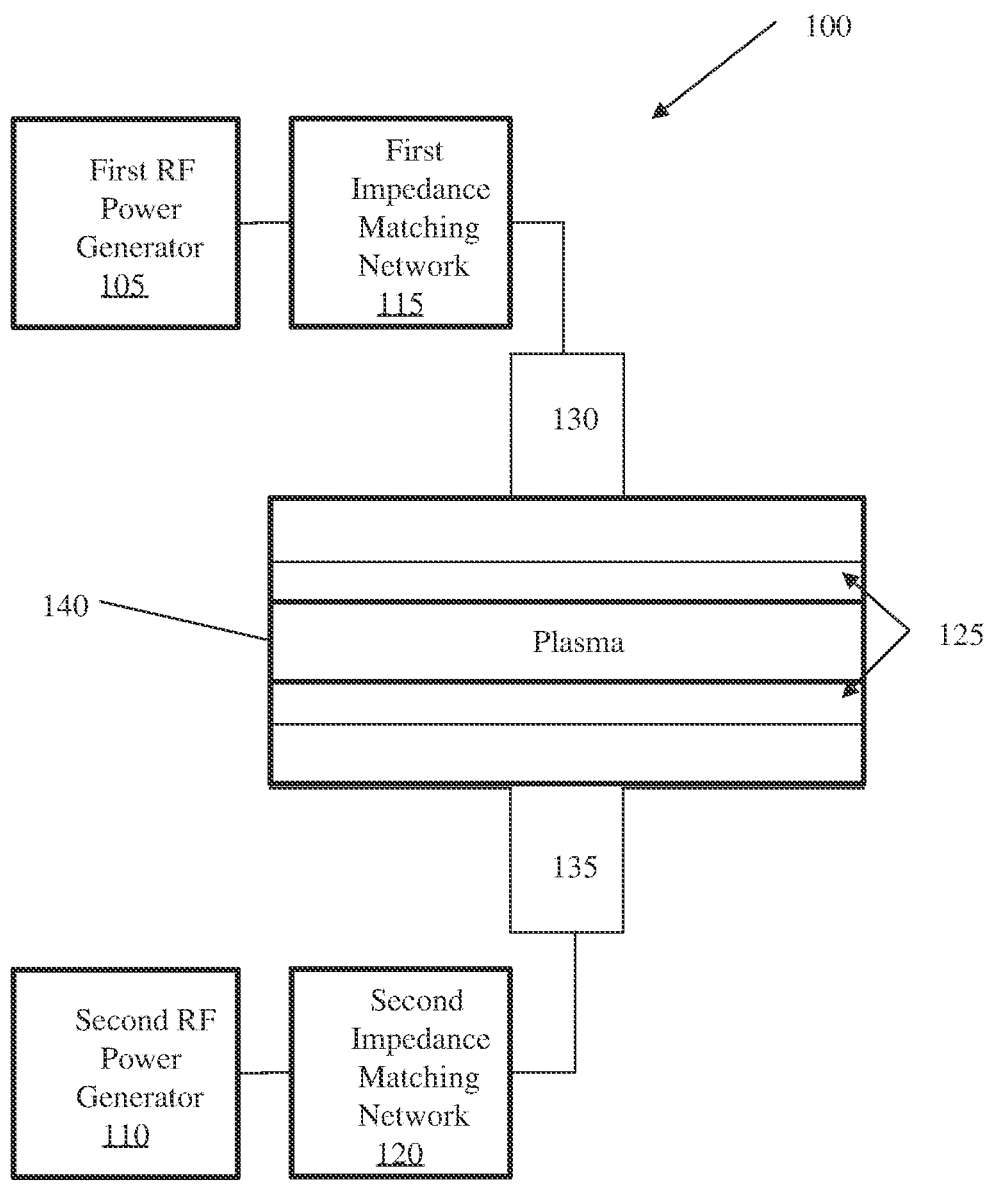
FIG. 1 is a block diagram representation of a radio frequency plasma processing device according to embodiments of the present disclosure.

Illustrative examples of the subject matter claimed below will now be disclosed. In the interest of clarity, not all features of an actual implementation are described for every example in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

Embodiments of the present disclosure may provide systems and methods for tuning and otherwise controlling matching networks in radio frequency plasma processing devices. During operation, a radio frequency power generator may be energized to form a plasma within a reaction chamber. The plasma may be produced after a source gas is injected into the reaction chamber and power is supplied within the reaction chamber by the radio frequency power generator.

Under certain conditions, the power that is supplied to the reaction chamber may be reflected back from the reaction chamber. One cause of the reflected power may be a mismatch in the characteristic impedance of the system and the load formed by the plasma within the reaction chamber. To help prevent reflected power, an impedance matching network may be disposed between the radio frequency power generator and the reaction chamber. Such impedance matching networks may include a number of variable capacitors or other impedance elements. The variable capacitors may be tuned so that the complex load impedance within the reaction chamber matches the impedance of the radio frequency power generator.

While multiple methods of controlling or otherwise tuning impedance matching networks have been used, such methods may not reliably and efficiently result in impedance matching. Matching networks may include stepper motors, which have a specific number of steps that are a function unique to a particular stepper motor. During operation, a capacitor may be driven by a motor that has a range between zero and one hundred percent. Embodiments of the present disclosure may provide for the adjustment of a capacitor position based, at least in part, on "variable gain algorithm" where the gain value used in adjustment calculations comes from a pre-defined table or from a calculation based on currently and/or recently measured values. The calculations may or may not utilize values from the above-mentioned pre-defined table (i.e., gain values may be based on calculations alone). In some cases, the adjustments will have a greater magnitude when current conditions are further away from their target values and smaller magnitude when measurements are near target.

Embodiments of the present disclosure may provide systems and methods for the operation of matching networks using a variable gain algorithm to minimize, or at least address, the currently experienced problems identified above. For example, addressing the above issues may include adjusting a property of one or more capacitors within the matching network. In some embodiments, changes to impedance may be made in non-linear fashion. In some cases, a different gain values may be used for a high region of operation versus a low region of operation (See FIG. 5). Specifically, different capacitor stepper motor gain values may be used for different capacitor regions of operation.

Some capacitors may have two or more different regions of operation (e.g., regions that are stable for the uses disclosed herein). For example, a capacitor may have a region A and a region B that are both designated as regions of operation for that capacitor. If a fixed gain is used, adjustments may be stable in region A but too slow for region B. If you increase the fixed gain value, oscillations may occur in region A with stability for region B. Accordingly, it may be desirable to utilize variable gain values that are altered for the different regions of operation for distinct capacitors. Having optimized and variable gain values for both region A and region B (that are different from each other) may eliminate oscillations or slow-tuning. The non-linear nature of capacitors is outlined in table 1 below. Note that Table 1 is merely a single example used for illustration purposes, different capacitors will have different values than the those shown.

TABLE 1

| Steps | Capacitance (pF) | pF/ Steps | Reactance (Ohms) | Ohms/ steps |
|---|---|---|---|---|
| 0 | 8.1 | | −1449.02 | |
| 100 | 8.6 | 0.005 | −1364.78 | 0.84 |
| 200 | 9.3 | 0.007 | −1262.05 | 1.03 |
| 300 | 10.3 | 0.010 | −1139.52 | 1.23 |
| 400 | 11.9 | 0.016 | −986.31 | 1.53 |
| 500 | 15.3 | 0.034 | −767.13 | 2.19 |
| 600 | 25.8 | 0.105 | −454.93 | 3.12 |

TABLE 1-continued

| Steps | Capacitance (pF) | pF/ Steps | Reactance (Ohms) | Ohms/ steps |
|---|---|---|---|---|
| 700 | 45.2 | 0.194 | −259.67 | 1.95 |
| 800 | 65.5 | 0.203 | −179.19 | 0.80 |
| 900 | 86.1 | 0.206 | −136.32 | 0.43 |
| 1000 | 106.7 | 0.206 | −110.00 | 0.26 |
| 1100 | 127.4 | 0.207 | −92.13 | 0.18 |
| 1200 | 148.2 | 0.208 | −79.20 | 0.13 |
| 1300 | 169.0 | 0.208 | −69.45 | 0.10 |
| 1400 | 189.8 | 0.209 | −61.81 | 0.08 |
| 1500 | 211.3 | 0.211 | −55.63 | 0.06 |
| 1600 | 232.0 | 0.210 | −50.59 | 0.05 |
| 1700 | 253.1 | 0.211 | −46.37 | 0.04 |
| 1800 | 274.2 | 0.211 | −42.80 | 0.04 |
| 1900 | 295.5 | 0.213 | −39.72 | 0.03 |
| 2000 | 316.6 | 0.211 | −37.07 | 0.03 |
| 2100 | 337.9 | 0.213 | −34.74 | 0.02 |
| 2200 | 359.1 | 0.212 | −32.68 | 0.02 |
| 2300 | 380.4 | 0.213 | −30.85 | 0.02 |
| 2400 | 401.6 | 0.212 | −29.23 | 0.02 |
| 2500 | 422.8 | 0.212 | −27.76 | 0.01 |
| 2600 | 444.1 | 0.213 | −26.43 | 0.01 |
| 2665 | 458.0 | 0.214 | −25.63 | 0.01 |

For some (if not most) systems it may be difficult to have the response of the control system be critically damped in all regions of operation with a fixed gain. The response of the control system may be over-damped and under-damped in different regions with a fixed gain. By varying the gain based on region of operation, the same system can be critically damped in all regions of operation.

Additionally, in some cases, the variable gain amount may be based on two related factors such as frequency and duty cycle settings from the radio frequency power generator. Accordingly, for a given frequency the amount of gain may be different based on different duty cycle values (See FIG. 4). Overall, one goal of the presently disclosed matching network is to optimize tuning toward a setpoint of 50 Ohms or for adjusting capacitors in general. Another goal is to allow for critical damping to be possible across different regions of operation for a capacitor. In short, it has been recognized that using a variable gain algorithm as discussed herein, offers improvements and flexibility over utilization of a fixed gain as is traditionally implemented.

Turning to FIG. 1, a block diagram representation of a radio frequency plasma processing system 100 is illustrated, according to embodiments of the present disclosure. Radio frequency plasma processing system 100 may include one or more radio frequency power generators such as a first radio frequency power generator 105 and a second radio frequency power generator 110. The radio frequency plasma processing system 100 may also include a first impedance matching network 115, a second impedance matching network 120, a sheath 125, a plasma powering device, such as showerhead 130 or equivalent powered element such as an electrode, and a pedestal 135. As used herein, plasma power devices may refer to any device that introduces power to generate plasma and may include, for example, showerhead 130 and/or other types of electrodes, as well as antennae and the like.

One or more of the first and second radio frequency power generators 105, 110 may deliver power to a reaction chamber 140 through one or more impedance matching networks 115, 120. In this example, radio frequency power flows from the first radio frequency power generator 105 through the first impedance matching network 115 to showerhead 130 into plasma in reaction chamber 140, to an electrode (not shown) other than showerhead 130, or to an inductive antenna (also not shown) that electromagnetically provides power to the plasma. The power flows from the plasma to ground and/or to pedestal 135 and/or to second impedance matching network 120. Generally, first impedance matching network 115 compensates for variations in a load impedance inside reaction chamber 140 so the combined impedance of showerhead 130 and first impedance matching network 115 is equal to the optimal load impedance of the first radio frequency power generator 105 by adjusting the reactive components (not separately shown), e.g., variable capacitors, within first impedance matching network 115.

In certain examples, first radio frequency generator 105 may provide power at a RF frequency between about 350 KHz and 162 MHz, while second radio frequency power generator 110 connected to pedestal 135 may supply power at a radio frequency lower than that of first radio frequency power generator 105. However, in certain implementations, second radio frequency power generator 110 may not supply power at a radio frequency lower than that of first radio frequency power generator 105. Typically, the frequencies of first and second radio frequency power generators 105, 110 are such that first radio frequency power generator 105 is at a radio frequency that is not an integer multiple, nor an integer fraction, of the frequency of second radio frequency power generator 110.

Impedance matching networks 115, 120 are designed to adjust their internal reactive elements such that the load impedance matches the source impedance. In other examples of the plasma processing system 100, different numbers of radio frequency power generators 105/110 may be used, as well as different numbers of impedance matching networks 115/120. Impedance matching networks 115/120 may include a number of internal components, such as inductors and variable capacitors that will be discussed in greater detail below.

Figure 2:
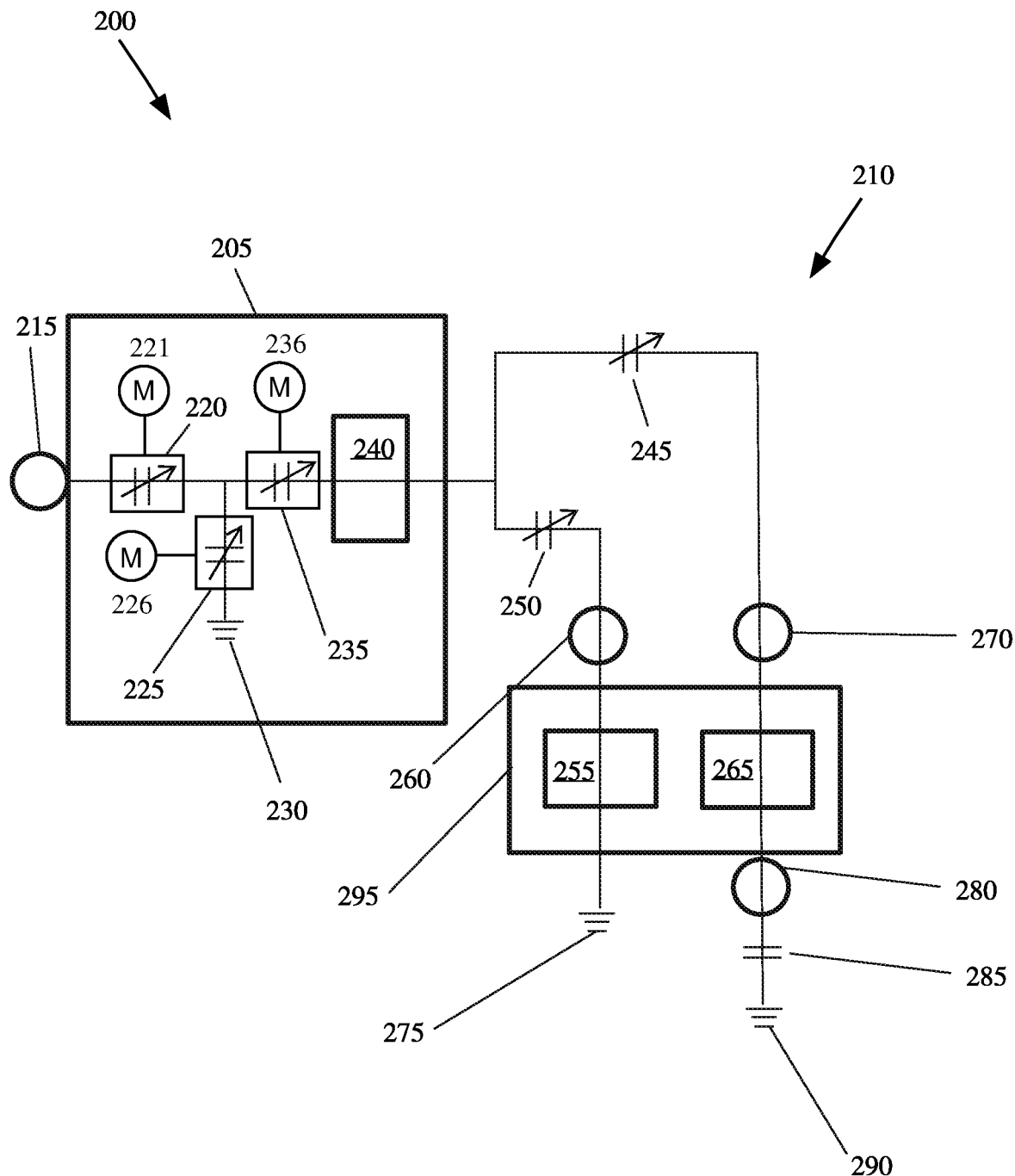
FIG. 2 is a schematic representation of a matching network as may be employed in a radio frequency plasma processing device according to embodiments of the present disclosure.

Turning to FIG. 2, a schematic representation of an impedance matching network 200, which may be implemented as the first impedance matching network 115 in FIG. 1, according to embodiments of the present disclosure is shown. In this embodiment, a matching network 200, such as those described above with respect to FIG. 1, is illustrated having a matching branch 205 and a splitter branch 210. Matching branch 205 receives radio frequency power from a radio frequency power generator through an input 215. A first variable capacitor 220 of the matching branch 205 receives the radio frequency power from the input 215. First variable capacitor 220 may include a capacitor with a capacitance range of approximately 10-2000 pF. First variable capacitor 220 may be used for tuning phase and/or magnitude for impedance matching network 200 that includes splitter branch 210.

First variable capacitor 220 controlled by a first tuning motor 211 is connected to a second capacitor 225 controlled by a second tuning motor 226, which is connected to a ground 230. First variable capacitor 220 and second capacitor 225 are also connected to a third variable capacitor 235 controlled by a third tuning motor 236. Third variable capacitor 235 may include a capacitor with a capacitance range of approximately 10-2000 pF. Third variable capacitor 235 is also connected to an inductor 240, which further connects to splitter branch 210. Third variable capacitor 235 may be used for adjusting the phase and/or magnitude for impedance matching network 200 that includes splitter branch 210 (inner branch to outer branch).

Splitter branch 210 receives radio frequency power from matching branch 205, which splits the received radio frequency power between a fourth variable capacitor 245 controlled by a fourth tuning motor 246 and a fifth variable capacitor 250 controlled by a fifth tuning motor 251. Fourth variable capacitor 245 and fifth variable capacitor 250 control the current split ratio of splitter branch 210. Fourth variable capacitor 245 may have a capacitance range of approximately 10-2000 pF while fifth variable capacitor 250 may have a capacitance range of approximately 10-2000 pF.

Fifth variable capacitor 250 is connected to an inner coil 255 (e.g., as mentioned above, an inductive antenna that electromagnetically provides power to the plasma). Between fifth variable capacitor 250 and inner coil 255 on the inner branch section of splitter branch 210, one or more sensors 260 may be disposed. Sensor 260 may be used to measure, for example, voltage between fifth variable capacitor 250 and ground 275. Similarly, fourth variable capacitor 245 is connected to an outer coil 265 on the outer branch section of splitter branch 210. Between fourth variable capacitor 245 and outer coil 265, one or more sensors 270 may be disposed. Sensors 270 may be used to measure, for example, voltage between fourth variable capacitor 245 and ground 290.

Inner coil 255 may further be connected to a ground 275 and outer coil 265 may be connected to circuitry that includes a sensor 280 and a sixth capacitor 285. Sensor 280 may be used to measure, for example, voltage between outer coil 265 and ground 290. Inner coil 255 and outer coil 265 may be located outside of the circuitry of the matching network 200, as indicated by offset box 295.

As discussed above, the impedance matching network 200 in FIG. 2 may be tuned using the first variable capacitor 220, third variable capacitor 235, fourth variable capacitor 245, and fifth variable capacitor 250. By tuning first variable capacitor 220, third variable capacitor 235, fourth variable capacitor 245, and fifth variable capacitor 250 the power provided to inner coil 255 and outer coil 265 may be adjusted.

The impedance matching network 200, which in one embodiment may be employed as a current split ratio matching network, may be controlled using a programmable logic controller, such as the computing device 825, shown in FIG. 8 and discussed further below. The programmable logic controller may be disposed in or otherwise connected to matching network 200 in some embodiments. Suitable programmable logic controllers and associated components will be discussed further with respect to FIG. 3.

In other embodiments, the circuitry of matching network 200 may include fewer or additional components and the orientation of the circuitry may differ. For example, fewer or greater numbers of variable capacitors, inductors, sensors, and the like may be present. Additionally, in certain embodiments, a different orientation of coils, antennas, and the like may be used to provide tuned radio frequency power to a reaction chamber, such as the reaction chamber 140 shown in FIG. 1. Systems and methods disclosed herein may be used inductively coupled plasmas ("ICPs"), capacitively coupled plasmas ("CCPs"), helicon wave sources ("HWSs"), or any other plasma processing devices.

Figure 3:
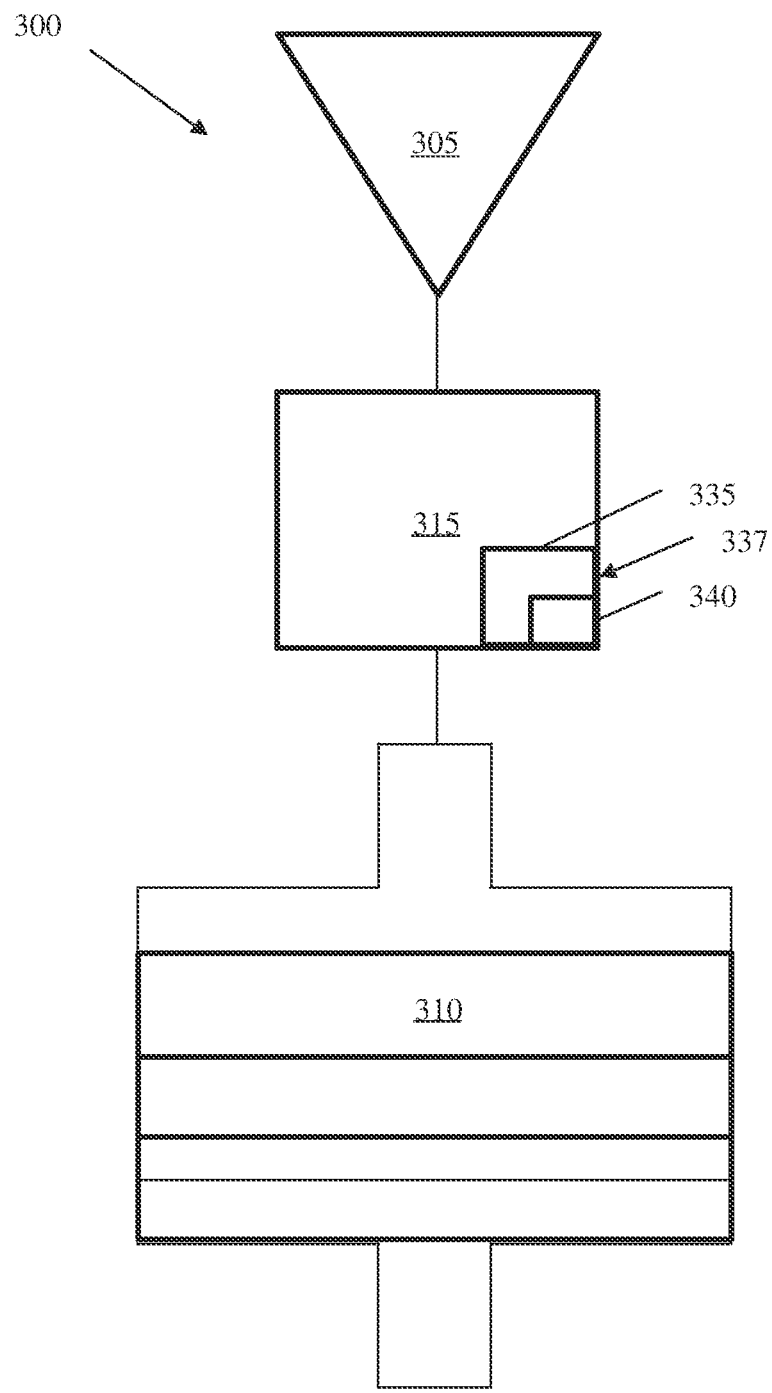
FIG. 3 is a schematic representation of a radio frequency plasma processing device according to embodiments of the present disclosure.

Turning to FIG. 3, a schematic representation of a radio frequency plasma processing device 300 according to embodiments of the present disclosure is shown. In this embodiment, radio frequency plasma processing device 300 includes a radio frequency power generator 305. Radio frequency power generator 305 is configured to provide power to reaction chamber 310. Radio frequency power generator 305 may provide power at a radio frequency between about 350 KHz and about 162 MHz. In certain embodiments, a second radio frequency power generator (not shown) may also be present within radio frequency plasma processing device 300 and may provide power at a radio frequency that is the same, lower, or higher than radio frequency power generator 305.

Reaction chamber 310 may include various components that allow for the processing of a manufacturing operation, such as those associated with the semiconductor industries. Reaction chamber 310 may include one or more sensors (not shown) for measuring certain properties occurring within reaction chamber 310. Reaction chamber 310 may also include a pedestal (also not shown) on which substrates to be manufactured may be placed during operation. Reaction chamber 310 may also include or otherwise be connected to coils (not individually shown), such as those discussed above, as well as showerheads, etc.

Radio frequency plasma processing device 300 may also include a matching network 315. Matching network 315 may be located between radio frequency power generator 305 and reaction chamber 310. Matching network 315 may include variable capacitors (not shown), as well as other components to balance impedance between radio frequency power generator 305 and reaction chamber 310, as discussed in greater detail above. For example, to transform the impedance of reaction chamber 310 to the "ideal" load impedance of the radio frequency power generator 305. During operation, the matching network may be tuned, e.g., by adjusting capacitor positions, in order to provide the matching impedances. The adjustments may be determined, in part, using a variable gain algorithm as described herein.

During operation, as power is supplied from radio frequency power generator 305 to a plasma (not shown) within reaction chamber 310, a condition may occur, such as power may be reflected from reaction chamber 310. Such reflected power may result in undesirable conditions that result in inefficient processing, damage to a substrate, damage to components of radio frequency plasma processing device 300, and the like. To resolve the condition and improve operability of radio frequency plasma processing device 300, a tuning module 337 includes programmable logic controller 335 that may provide commands to matching network 315 to adjust a capacitor position, thereby providing matching impedances to minimize reflected power. Programmable logic controller 335 may be connected to storage device 340 to store these commands or data obtained during operation.

During operation, programmable logic controller 335 may identify a capacitor within matching network 315. For example, if the impedance matching network 315 is implemented in the manner shown in FIG. 2, the identified capacitor may be any one of the variable capacitors 220, 235, 245, and/or 250. The identifying may occur automatically—i.e., under programmed control or otherwise without human intervention—or be controlled by an operator.

Adjustments to variable capacitors may be made in different ways. In one example, adjustments are made by changing the capacitance of the capacitor using a stepper motor associated with the capacitor. In some cases, a zero step value may represent the point of minimum capacitance within a capacitor's usable range. That same capacitor may have a maximum step value (e.g., 1000 steps) the represents the point of maximum capacitance within the capacitor's usable range. During operation, the capacitance of the capacitor may be varied by changing the step value to a number between zero and 1000, for example.

To assist in a variable gain algorithm implementation, like that of the present disclosure, different amounts of adjustments may be impacted by a gain value that is either calculated or determined from a pre-defined table. Examples of calculations and gain value tables are discussed below. These calculations or tables may be stored in programmable logic (e.g., for use by programmable logic controller 335) or in a database (e.g., database on storage device 340), which may be used during operation to adjust operation of matching network 315. As such, the impedance for a particular capacitor position may be determined during operation of matching network 315. Using the measured impedance for each position of the capacitors for matching network 315, a table is constructed reflecting variable gain adjustments to apply to one or more of the capacitors, thereby optimizing the tuning conditions for a plasma processing device.

Figure 4:
FIG. 4 is a table showing one example of many possible implementations for different variable gain values and techniques (based on frequency and duty cycle of a radio frequency power generator) according to embodiments of the present disclosure.

Turning to FIGS. 4 and 5, in FIG. 4 an example table 400 that utilizes a dual set of indexes (i.e., frequency and duty cycle) is illustrated and in FIG. 5 another example table 500 that provides different up gain and down gain values based on whether the capacitor is increasing or decreasing capacitance as well as for different current split ratio targets is illustrated. That is, the gain values may be dependent on several factors. In some cases, the gain values may be determined utilizing a calculation (e.g., different types of gain equations) without reference to any pre-defined table values. In some cases, dynamic averaging techniques may be used as part of the calculations to determine a particular gain value for the variable gain technique (e.g., based on how close the match is to the targeted region of operation). The further away from target, the less averaging may be used to respond more quickly (coarse adjustment) whereas the closer to target more averaging (fine adjustment) may be used. Values included in gain determination calculations may include: generator pulsing frequency, generator pulsing duty cycle, load impedance, plasma processing condition, capacitance range, or combinations thereof. This listing is not intended to be exhaustive and other values may be used for calculations depending on the implementation.

Techniques disclosed herein may control speed with which a variable capacitor is adjusted based on a match region of operation, and whether the capacitor is trying to increase or decrease capacitance to achieve the target match region of operation. Speed gains are scheduled in table 500 based on match region of operation (FIG. 5). Furthermore, speed gains can be scheduled based on radio frequency generator pulsing frequency and duty cycle as illustrated in table 400 (FIG. 4). Additionally, control of variable capacitor speed may be based on a desired rate of change of capacitance. Capacitors may be driven quickly when far away from the target and, then stabilized (e.g., by reducing the rate of change) as they approach the target.

As explained throughout this disclosure, using a variable gain may have improvements over previously implemented fixed gain adjustments. For example, a traditional motor speed adjustment may be determined by a calculation as shown here:

$$\text{Polarity} \times \text{Gain} \times \text{Speed}_{to}\text{Signal} \times \text{Error\_Signal} \leq \text{Speed Limit}$$

where: Polarity indicates direction of capacitor movement; Gain is traditionally a fixed value; Speed_to_Signal is typically a fixed value; and Error_signal indicates a distance from a match target region.

Using a variable gain adjustment, the above Gain value is not fixed. The Gain value may be obtained from an equation and/or from a table. The equation may or may not utilize pre-defined values from a table.

Further, one example equation to determine control of a variable capacitor speed based on a match region of operation (Region for short) is shown here:

$$\text{Gain} = \text{Scalar} * e^{Region * Exponent}$$

Another example equation for dynamic averaging (as discussed above) for use with a variable gain adjustment is shown here:

$$\text{ErrorFilt}(n) = \text{alpha} \times \text{ErrorRaw}(n) + [1 + \text{alpha}] \times \text{ErrorFilt}(n-1), 0 < \text{alpha} < 1$$

where: alpha is decreased as you approach match target region.
Note this is an example of a recursive equation where a filtered value (ErrorFilt current) is utilized to determine a next filtered value (ErrorFilt next) based on an unfiltered adjustment value (ErrorRaw). Dynamic averaging may be implemented using a rolling average within a fixed window or with a dynamic window based on a distance from the target match region of operation.

Figure 6A:
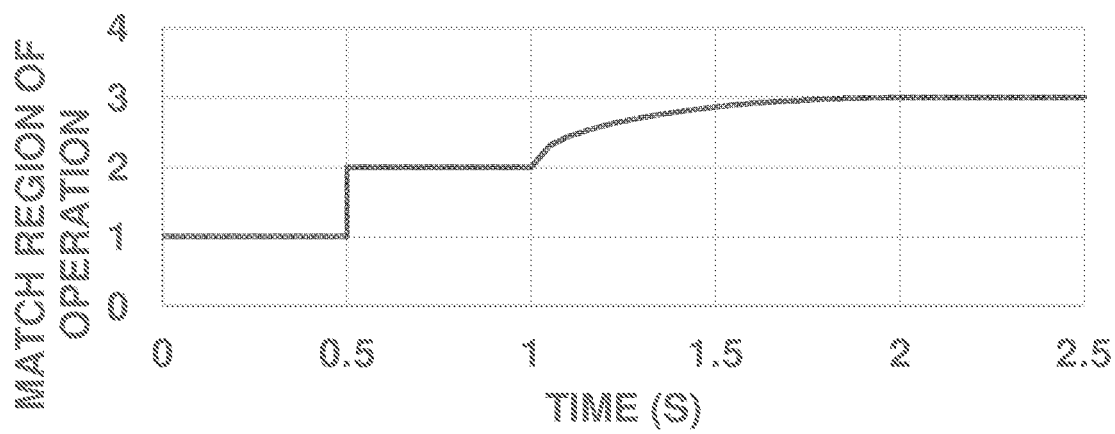
FIGS. 6A-C are graph representations depicting various timings for tuning to collectively illustrate possible improvements that may be found in a variable gain tuning implementation of this disclosure.
Figure 6B:
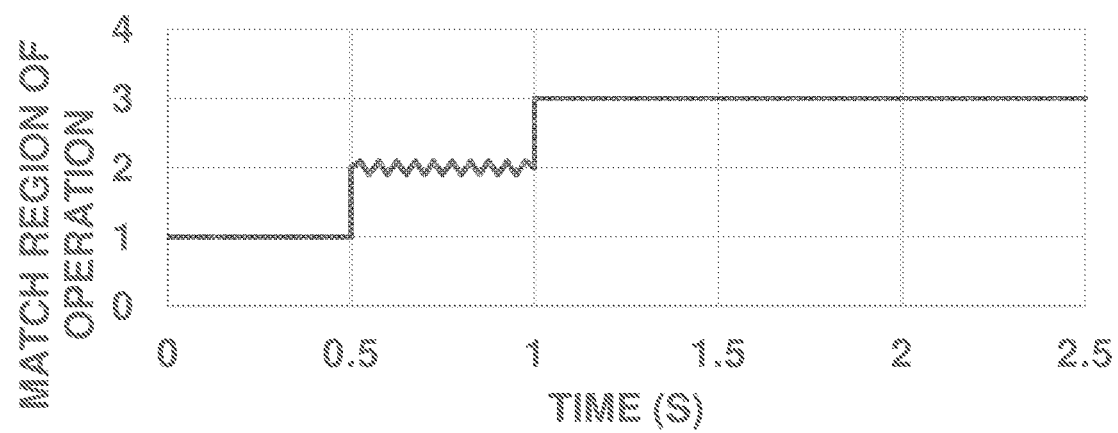
Figure 6C:
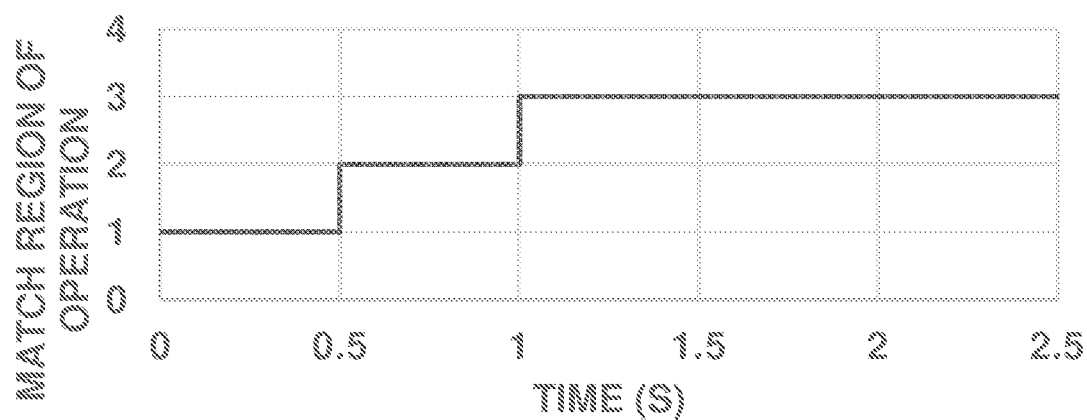

Turning to FIGS. 6A-C, different timing diagrams are illustrated. FIG. 6A illustrates a graph of a tuning process using a fixed gain that is too slow between match region of operation 2 and match region of operation 3 (e.g., because of the delay in adjustment between time 1 and time 1.5). In this case we have an underdamped adjustment. FIG. 6B illustrates a graph of a tuning process also using a fixed gain that is too fast (e.g., because of the erratic nature of the graph between time 0.5 and time 1). The erratic nature illustrates those adjustments are being made too quickly and over-shooting the desired stable adjustment such that we have an overdamped adjustment. FIG. 6C illustrates a graph of what may be expected using the disclosed variable gain algorithm and as indicated in the graph, the issues illustrated in FIGS. 6A and 6B are no longer present. In this case we have a critically damped adjustment.

Figure 7:
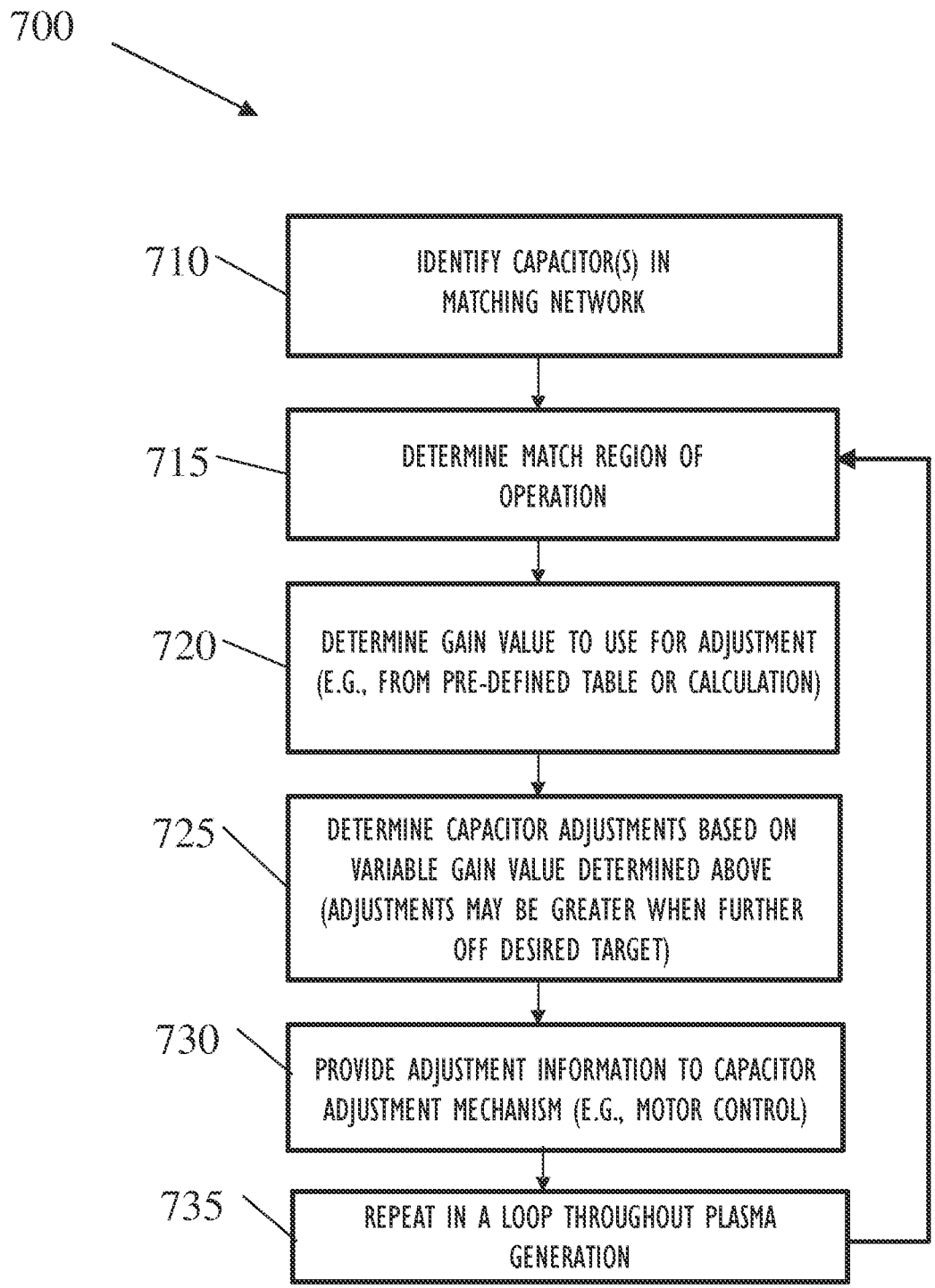
FIG. 7 is a flowchart of one example method for using a variable gain algorithm as part of tuning a matching network in a radio frequency plasma processing device according to embodiments of the present disclosure.

Turning to FIG. 7, a flowchart of a method 700 for using a variable gain algorithm to adjust capacitors in a matching network in a radio frequency plasma processing device, according to embodiments of the present disclosure is shown. The method 700 may include identifying (block 710) a capacitor in the matching network. The identifying may include determining a specific capacitor within a matching network and/or may include determining more than one capacitor within the matching network. The capacitors may include variable capacitors, such as those discussed above.

During operation, method 700 may further include determining a match region of operation (block 715), the match region of operation for a given capacitor indicates which gain values may be used, because, as explained above, it may be desirable to have different gain values to allow for critical damping within different regions of operation for a capacitor. Also, as explained above for FIG. 5, a match region of operation may be used to determine values for either an up gain or a down gain to utilize for adjustment of a capacitor within the matching network. When the match region of operation is far away from a desired region, adjustments may be increased relative to adjustments made when the match region of operation is close to the target.

During operation, method 700, may further include determining a gain value (block 720) to use for adjustment of one or more capacitors within the match network. As mentioned above, typical matching networks utilize a fixed gain value, whereas the matching network described herein utilizes a variable gain feature. The gain value for disclosed embodiments may utilize a gain value obtained from one or more pre-defined tables where lookup is based on current (or recent) operational characteristics of the matching network. In other examples, the gain value may be derived from a calculation based on current attributes (e.g., measurements) of the matching network. In some cases, a combination of lookup and calculation may be utilized.

During operation, method 700 may further include determining capacitor adjustments based on the variable gain value determined previously (block 725). The adjustments may be made to effect the best available tuning parameters for the matching network. As mentioned above, a properly tuned matching network optimizes power delivered to the plasma chamber in operation.

During operation, method 700 may further include providing the adjustment information (block 730) to a capacitor to adjust that capacitor to a specific impedance based on the measured values. When the range of capacitor positions are known for a specific capacitor within a matching network, the capacitor positions may be tuned in order to provide an optimized capacitor position for a particular operation. Finally, during operation, method 700 may repeat (block 735 loop to block 715) itself throughout a plasma generation operation.

Figure 8:
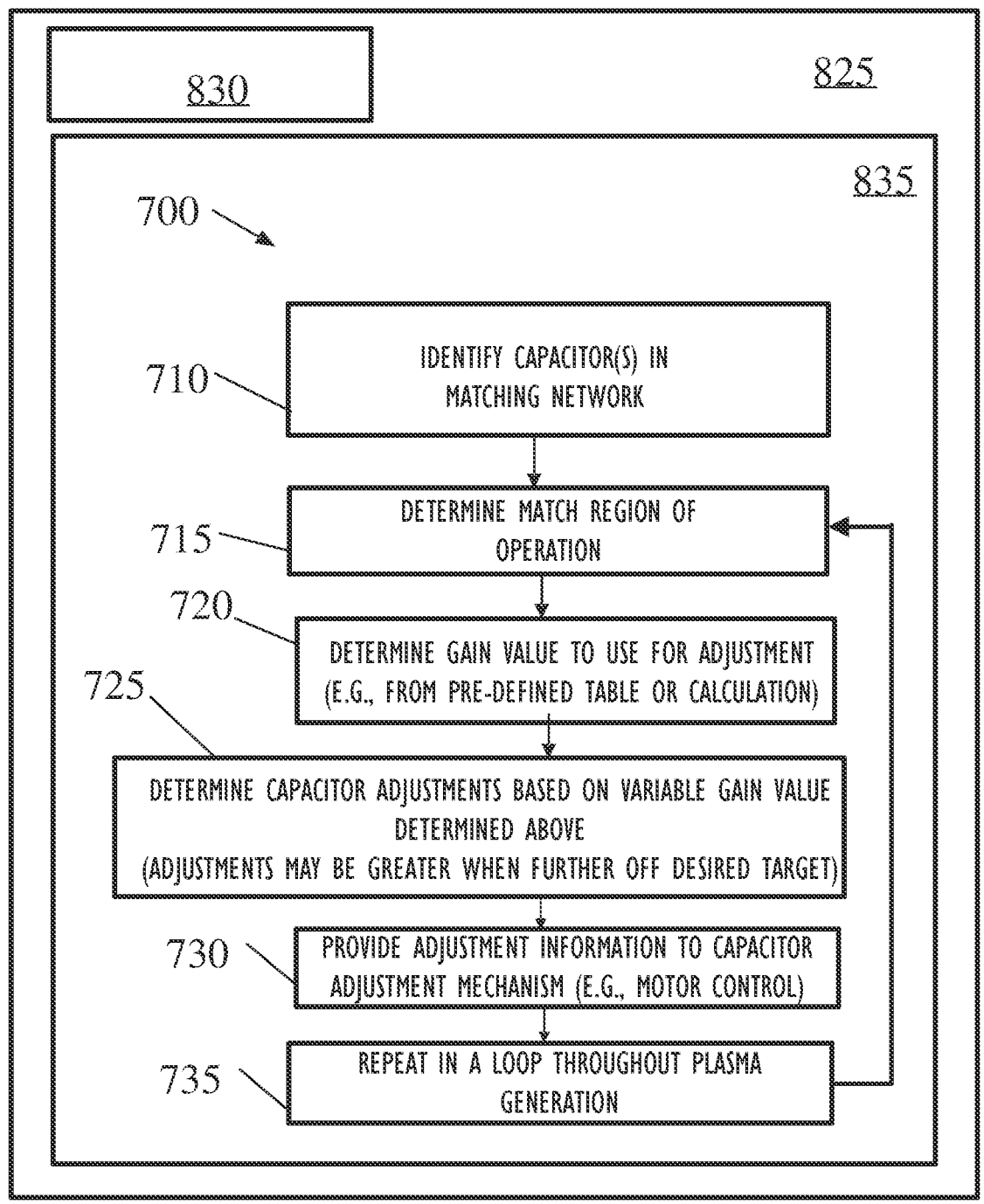
FIG. 8 is an example computing device with a hardware processor and accessible machine-readable instructions (e.g., instructions stored in a non-transitory computer readable medium) to implement the example method of FIG. 7 in accordance with one or more examples of the present disclosure.

Turning now to FIG. 8, an example computing device with a hardware processor and accessible machine-readable instructions (to implement example method 700) is shown in accordance with one or more examples of the present disclosure. FIG. 8 provides an example computing device 825, with a hardware processor 830, and accessible machine-readable instructions stored on a machine-readable medium 835 for managing data as discussed above with respect to one or more disclosed example implementations. FIG. 8 illustrates computing device 825 configured to perform the flow described in the example method discussed in detail with respect to FIG. 7. However, computing device 825 may also be configured to perform the flow of other methods, techniques, functions, or processes described in this disclosure.

Figure 9:
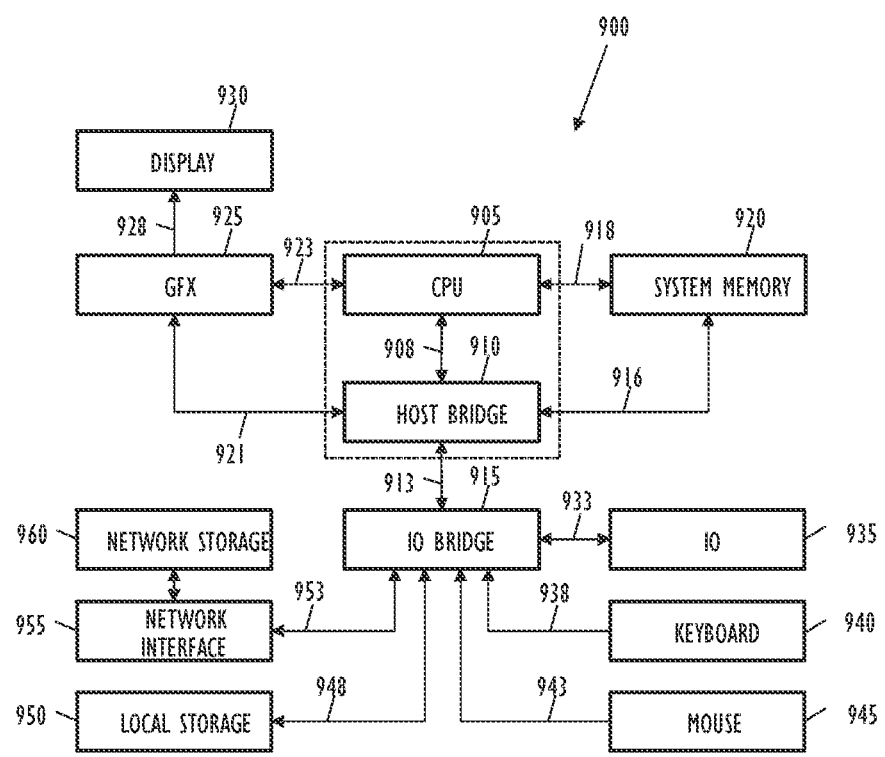
FIG. 9 is a schematic representation of a computer processing device that may be used to implement functions and processes in accordance with one or more examples of the present disclosure.

FIG. 9 illustrates a block diagram 950 that includes multiple components that may be used to implement method 700 or other functions described herein. Specifically block diagram 950 illustrates one possible relationship between an impedance analyzer 955, a match component 965, and a splitter 975. Based on readings of sensors or measurement values obtained at impedance analyzer 955, the tables of FIGS. 4A-B, the equations of FIGS. 5A-B, and the processing devices described herein, a tuning network utilizing a variable gain algorithm may be implemented according to one or more disclosed embodiments.

Referring now to FIG. 9, a schematic representation of a computer processing device 900 that may be used to implement functions and processes in accordance with one or more examples of the present disclosure is shown. FIG. 9 illustrates a computer processing device 900 that may be used to implement the systems, methods, and processes of this disclosure. For example, computer processing device 900 illustrated in FIG. 9 could represent a client device or a physical server device and include either hardware or virtual processor(s) depending on the level of abstraction of the computing device. In some instances (without abstraction), computer processing device 900 and its elements, as shown in FIG. 9, each relate to physical hardware. Alternatively, in some instances one, more, or all of the elements could be implemented using emulators or virtual machines as levels of abstraction. In any case, no matter how many levels of abstraction away from the physical hardware, computer processing device 900 at its lowest level may be implemented on physical hardware. In one implementation, computer processing device 900 may allow a subscriber to remotely access one or more data centers. Similarly, the management tool used by the subscriber may include a software solution that runs on such a computer processing device 900.

FIG. 9 shows a computer processing device 900 in accordance with one or more examples of the present disclosure. Computer processing device 900 may be used to implement aspects of the present disclosure, such as aspects associated with the tuning module, the matching network, or other components of a radio frequency plasma processing device. Computer processing device 900 may include one or more central processing units (singular "CPU" or plural "CPUs") 905 disposed on one or more printed circuit boards (not otherwise shown). Computer processing device 900 may further include any type of processing deice or programmable logic controller known in the art. Computer processing device 900 may also perform the functions of a controller, as a processor, and be used according to the methods and systems described above with respect to FIGS. 1-9. As such, computer processing device 900 may be a controller, processor, perform the functions of the controller and/or processor, and may be used to determine and/or adjust capacitor positions within a matching network.

Each of the one or more CPUs 905 may be a single-core processor (not independently illustrated) or a multi-core processor (not independently illustrated). Multi-core processors typically include a plurality of processor cores (not shown) disposed on the same physical die (not shown) or a plurality of processor cores (not shown) disposed on multiple die (not shown) that are collectively disposed within the same mechanical package (not shown). Computer processing device 900 may include one or more core logic devices such as, for example, host bridge 910 and input/output ("IO") bridge 915.

CPU 905 may include an interface 908 to host bridge 910, an interface 918 to system memory 920, and an interface 923 to one or more IO devices, such as, for example, graphics processing unit ("GFX") 925. GFX 925 may include one or more graphics processor cores (not independently shown) and an interface 928 to display 930. In certain embodiments, CPU 905 may integrate the functionality of GFX 925 and interface directly (not shown) with display 930. Host bridge 910 may include an interface 908 to CPU 905, an interface 913 to IO bridge 915, for embodiments where CPU 905 does not include interface 918 to system memory 920, an interface 916 to system memory 920, and for embodiments where CPU 905 does not include integrated GFX 925 or interface 923 to GFX 925, an interface 921 to GFX 925.

One of ordinary skill in the art will recognize that CPU 905 and host bridge 910 may be integrated, in whole or in part, to reduce chip count, motherboard footprint, thermal design power, and power consumption. IO bridge 915 may include an interface 913 to host bridge 910, one or more interfaces 933 to one or more IO expansion devices 935, an interface 938 to keyboard 940, an interface 943 to mouse 945, an interface 948 to one or more local storage devices 950, and an interface 953 to one or more network interface devices 955.

Each local storage device 950 may be a solid-state memory device, a solid-state memory device array, a hard disk drive, a hard disk drive array, or any other non-transitory computer readable medium. Each network interface device 955 may provide one or more network interfaces including, for example, Ethernet, Fibre Channel, WiMAX, Wi-Fi, Bluetooth, EtherCAT, Device Net, Mod Bus, RS-232, or any other network protocol suitable to facilitate networked communications. Computer processing device 900 may include one or more network-attached storage devices 960 in addition to, or instead of, one or more local storage devices 950. Network-attached storage device 960 may be a solid-state memory device, a solid-state memory device array, a hard disk drive, a hard disk drive array, or any other non-transitory computer readable medium. Network-attached storage device 960 may or may not be collocated with computer processing device 900 and may be accessible to computer processing device 900 via one or more network interfaces provided by one or more network interface devices 955.

One of ordinary skill in the art will recognize that computer processing device 900 may include one or more application specific integrated circuits ("ASICs") that are configured to perform a certain function, such as, for example, hashing (not shown), in a more efficient manner. The one or more ASICs may interface directly with an interface of CPU 905, host bridge 910, or IO bridge 915. Alternatively, an application-specific computing device (not shown), sometimes referred to as mining systems, may be reduced to only those components necessary to perform the desired function, such as hashing via one or more hashing ASICs, to reduce chip count, motherboard footprint, thermal design power, and power consumption. As such, one of ordinary skill in the art will recognize that the one or more CPUs 905, host bridge 910, IO bridge 915, or ASICs or various sub-sets, super-sets, or combinations of functions or features thereof, may be integrated, in whole or in part, or distributed among various devices in a way that may vary based on an application, design, or form factor in accordance with one or more example embodiments. As such, the description of computer processing device 900 is merely exemplary and not intended to limit the type, kind, or configuration of components that constitute a computing device suitable for performing computing operations, including, but not limited to, hashing functions. Additionally, one of ordinary skill in the art will recognize that computer device 900, an application specific computing device (not shown), or combination thereof, may be disposed in a standalone, desktop, server, or rack mountable form factor.

One of ordinary skill in the art will recognize that computer processing device 900 may be a cloud-based server, a server, a workstation, a desktop, a laptop, a netbook, a tablet, a smartphone, a mobile device, and/or any other type of computing device in accordance with one or more example embodiments.

In certain embodiments, advantages of the present disclosure may provide for computer executable instructions for adjustment of capacitor positions associated with matching networks in radio frequency plasma processing devices.

In certain embodiments, advantages of the present disclosure may provide improved adjustment settings for tuning of capacitors associated with matching networks in radio frequency plasma processing devices.

In certain embodiments, advantages of the present disclosure may provide a method for storing variable gain table information for plasma processing conditions, which may assist in properly controlling different capacitor trajectories when attempting to match the rapidly changing conditions that may be present during operation of a plasma chamber.

The foregoing description, for purposes of explanation, used specific nomenclature to provide a thorough understanding of the disclosure. However, it will be apparent to one skilled in the art that the specific details are not required to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A matching network for a plasma processing system operatively connected between a radio frequency source and a plasma processing chamber comprising a match tuning capacitor, a tuning motor for changing capacitance of the match tuning capacitor, and a controller for driving the tuning motor by performing steps comprising:
   receiving one or more measurements from the plasma processing system;
   determining one or more factors based on the one or more measurements;
   determining a gain setting based the one or more factors;
   providing the gain setting to the tuning motor to change the capacitance of the match tuning capacitor; and
   repeating the previous steps to apply variable gain to the tuning motor to dampen adjustment of the tuning motor within different regions of operation of the match tuning capacitor in response to changes occurring over successive measurements during operation of the plasma processing system;
   wherein the variable gain avoids over-damped and under-damped adjustment of the tuning motor in the different regions of operation of the match tuning capacitor.

2. The matching network of claim 1, wherein the variable gain determines a variable speed of the tuning motor based on a match region of operation determined by a mathematical equation in the form:

$$Gain = Scalar * e^{Region * Exponent}.$$

3. The matching network of claim 1, wherein the variable gain provides critically damped adjustment of the tuning motor within the different regions of operation of the match tuning capacitor.

4. The matching network of claim 1, wherein the variable gain provides critically damped adjustment of the tuning motor within all regions of operation of the match tuning capacitor.

5. A matching network for a plasma processing system operatively connected between a radio frequency source and a plasma processing chamber comprising a match tuning capacitor, a tuning motor for changing capacitance of the match tuning capacitor, and a controller for driving the tuning motor by performing steps comprising:
   receiving one or more measurements from the plasma processing system;
   determining one or more factors based on the one or more measurements;
   determining a gain setting based the one or more factors;
   providing the gain setting to the tuning motor to change the capacitance of the match tuning capacitor; and
   repeating the previous steps to apply variable gain to the tuning motor to dampen adjustment of the tuning motor within different regions of operation of the match tuning capacitor in response to changes occurring over successive measurements during operation of the plasma processing system;
   determining a current match region of the matching network;
   determining a target region of the matching network; and
   determining a distance between the current match region and the target region,
   wherein at least one of the factors is based on the distance between the current match region and the target region.

6. The matching network of claim 5, wherein the variable gain drives a speed of the tuning motor more quickly when the distance is relatively large, and then reduces the speed of the tuning motor in response to a reduction in the distance.

7. A matching network for a plasma processing system operatively connected between a radio frequency source and a plasma processing chamber comprising a match tuning capacitor, a tuning motor for changing capacitance of the match tuning capacitor, and a controller for driving the tuning motor by performing steps comprising:
   receiving one or more measurements from the plasma processing system;
   determining one or more factors based on the one or more measurements;
   determining a gain setting based the one or more factors;
   providing the gain setting to the tuning motor to change the capacitance of the match tuning capacitor; and
   repeating the previous steps to apply variable gain to the tuning motor to dampen adjustment of the tuning motor within different regions of operation of the match tuning capacitor in response to changes occurring over successive measurements during operation of the plasma processing system;
   driving the speed of the tuning motor more quickly when the distance is relatively large to mitigate slow-tuning; and
   reducing the speed of the tuning motor as the matching network approaches the target match region to mitigate oscillation of the speed of the tuning motor.

8. The matching network of claim 1, wherein at least one of the factors is based whether successive capacitance values of the match tuning capacitor are increasing or decreasing.

9. The matching network of claim 1, further comprising:
   determining a match region of operation of the matching network;
   calculating or looking up the gain setting based on the match region of operation.

10. The matching network of claim 1, wherein:
    the match tuning capacitor is a first match tuning capacitor; and
    at least one of the factors is based on a split current ratio between the first match tuning capacitor and a second match tuning capacitor.

11. The matching network of claim 1, wherein the gain setting is based on a combination of two related factors.

12. The matching network of claim 1, wherein the gain setting is based on a combination of a calculated value and reference to a pre-defined table.

13. The matching network of claim 1, wherein the gain setting tunes the match network toward an impedance set-point of 50 Ohms.

14. The matching network of claim 1, wherein at least one of the factors is determined through calculation of a gain equation without reference to pre-defined table values.

15. The matching network of claim 1, wherein at least one of the factors is based on generator pulsing frequency.

16. The matching network of claim 1, wherein at least one of the factors is based on generator pulsing duty cycle.

17. The matching network of claim 1, wherein at least one of the factors is based on a capacitance range of the match tuning capacitor.

18. A matching network for a plasma processing system operatively connected between a radio frequency source and a plasma processing chamber comprising a match tuning capacitor, a tuning motor for changing capacitance of the match tuning capacitor, and a controller for driving the tuning motor by performing steps comprising:
- receiving one or more measurements from the plasma processing system;
- determining one or more factors based on the one or more measurements;
- determining a gain setting based the one or more factors;
- providing the gain setting to the tuning motor to change the capacitance of the match tuning capacitor; and
- repeating the previous steps to apply variable gain to the tuning motor to dampen adjustment of the tuning motor within different regions of operation of the match tuning capacitor in response to changes occurring over successive measurements during operation of the plasma processing system;
- wherein at least one of the factors is determined through dynamic averaging.

19. A method for adjusting a match tuning capacitor in a matching network in a radio frequency plasma processing device, the method including:
- determining a plurality of different variable gain settings for the match tuning capacitor based, at least in part, on a plurality of different match region of operation associated with the match tuning capacitor;
- applying the plurality of different variable gain settings to a feedback signal from the matching network to determine a plurality of different adjustments for the match tuning capacitor; and
- implementing the plurality of different adjustments for the match tuning capacitor;
- wherein:
  - the match tuning capacitor is responsive to both positive errors and negative errors in each match region of operation; and
  - the variable gain settings avoid over-damped and under-damped adjustment of the tuning motor in the different regions of operation of the match tuning capacitor.

20. A method for adjusting a match tuning capacitor in a matching network in a radio frequency plasma processing device, the method including:
- determining a first variable gain setting for the match tuning capacitor based, at least in part, on a first match region of operation associated with the match tuning capacitor;
- applying the first variable gain setting to a feedback signal from the matching network to determine a first adjustment for the match tuning capacitor;
- implementing the first adjustment for the match tuning capacitor;
- determining a second variable gain setting for the match tuning capacitor based, at least in part, on a second match region of operation associated with the match tuning capacitor;
- applying the second variable gain setting to the feedback signal from the matching network to determine a second adjustment for the match tuning capacitor; and
- implementing the second adjustment for the match tuning capacitor,
- wherein the variable gain settings avoid over-damped and under-damped adjustment of the tuning motor in the different regions of operation of the match tuning capacitor.

* * * * *